Inventor
Jouke N. Rypkema
By James E. Tracy
Attorney

Dec. 16, 1969 J. N. RYPKEMA 3,484,723

DOUBLY BALANCED MODULATOR WITH SUPPRESSED EVEN HARMONIC SIDEBANDS

Filed Dec. 1, 1966 2 Sheets-Sheet 2

Inventor
Jouke N. Rypkema

By James E. Tracy
Attorney

United States Patent Office 3,484,723 Patented Dec. 16, 1969

3,484,723

DOUBLY BALANCED MODULATOR WITH SUPPRESSED EVEN HARMONIC SIDEBANDS

Jouke N. Rypkema, Lombard, Ill., assignor to Zenith Radio Corporation, Chicago, Ill., a corporation of Delaware Filed Dec. 1, 1966, Ser. No. 598,450
Int. Cl. H03c *1/02*
U.S. Cl. 332—38 13 Claims

ABSTRACT OF THE DISCLOSURE

A pair of signal translating channels are rendered conductive in alternation, under the control of a carrier wave, to translate opposed phases of an intelligence signal through the channels in alternation to develop in a common load circuit a desired suppressed carrier amplitude modulated signal. To avoid the introduction into the suppressed carrier signal of undesired signal components, particularly the modulation sidebands of the even harmonics of the carrier fundamental, the two signal translating channels must be established in their conductive states for equal time intervals. The conduction time intervals of the two channels are adjustable in order that the desired equalization may be obtained.

Figure 1:
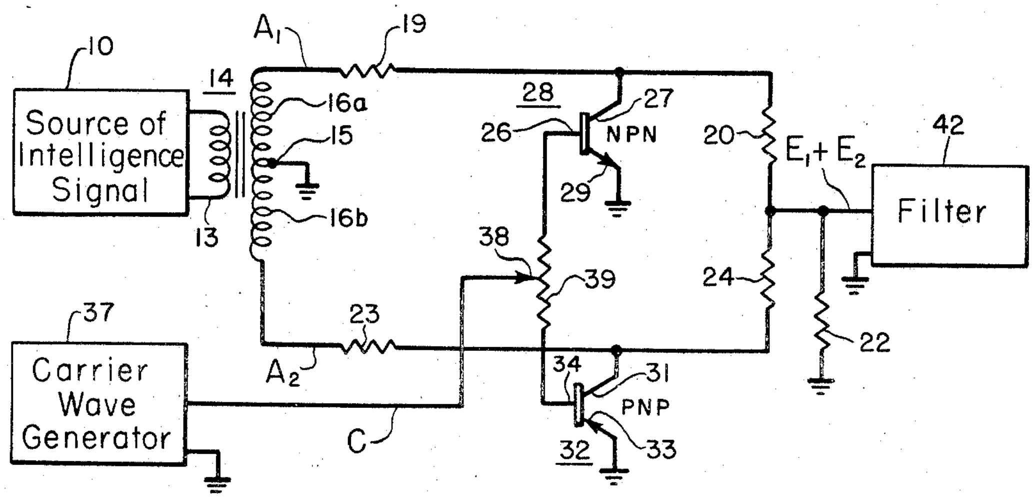

This invention pertains to a novel doubly balanced modulator for developing, from an intelligence signal and a carrier wave, a suppressed carrier amplitude modulated signal in which both the intelligence signal and carrier wave are completely cancelled or suppressed.

Critical precise balancing and symmetrical circuit elements are required in many prior doubly balanced modulators in order that the developed suppressed carrier signal contain only desired signal components—usually the modulation sidebands of the carrier fundamental. If there is the slightest unbalance in the operation of the modulator, undesired components, such as the original intelligence signal or modulation sidebands of the even harmonics of the carrier fundamental, will be introduced in the suppressed carrier signal, and these undesired components are especially prevalent when the modulator is required to handle relatively high amplitude signals.

Of course, depending on the environment of and purpose to be served by the doubly balanced modulator, there are times when those undesired signal components will be of no concern. By means of appropriate filtering it may be possible to segregate, on the basis of frequency, the wanted signal components from the remainder of the output signal of the modulator. This is particularly convenient when there is a relatively wide spacing between the carrier fundamental frequency and the portion of the frequency spectrum covered by the intelligence signal. When the carrier fundamental is relatively close to the highest frequency of the intelligence signal, however, unless the modulator is balanced it will not be possible to filter out only the wanted signal components. For example, it may be desired to select the upper modulation sideband of the carrier fundamental from the output signal of an unbalanced operating suppressed carrier modulator, but this will not be obtainable if the portion of the frequency spectrum embraced by that upper sideband is also common, at least in part, to the lower modulation sideband of the second harmonic of the fundamental. The intelligence information in the wanted sideband of the fundamental would be contaminated or masked by the second harmonic sideband, and filtering would be unable to remove such distortion.

Precisely balanced operating suppressed carrier modulators are required in many different applications. Unfortunately, prior suppressed carrier modulators, capable of balanced operation, are usually complex in circuit arrangement and relatively costly, particularly when large signals must be processed. The modulator of the present invention, on the other hand, achieves perfectly balanced operation and is able to handle high amplitude signals, and yet this is accomplished by means of a relatively inexpensive circuit requiring very few elements.

It is, therefore, an object of the present invention to provide a new and improved doubly balanced modulator.

It is another object to provide a suppressed carrier modulator which is considerably simpler and less expensive than those developed heretofore.

A doubly balanced modulator, constructed in accordance with one aspect of the invention, comprises a source of intelligence signal and a common load circuit. There is a first signal translating channel, coupled between the source and load circuit, having a conductive state in which the intelligence signal is translated with one phase to the load circuit and a nonconductive state in which the intelligence signal is effectively prevented from reaching the load circuit. A second signal translating channel is also coupled between the source and load circuit and this channel has a conductive state in which the intelligence signal is delivered with opposite phase to the load circuit and a nonconductive state in which the intelligence signal is effectively prevented from reaching the load circuit. A generator is provided for developing an alternating carrier wave having a predetermined funadmental frequency. There are means for utilizing the carrier wave to condition the first and second channels to their respective conductive states in alternation thereby to translate the intelligence signal to the load circuit through the channels in alternation to develop in the load circuit a desired suppressed carrier amplitude modulated signal which is subject to the introduction of undesired signal components in the event that the first and second channels are established in their conductive states for unequal time intervals. Finally, the modulator includes means for adjusting the conduction time intervals of at least one of the channels to equal the conduction intervals of the other channel to effect cancellation of the undesired signal components.

Figure 2:
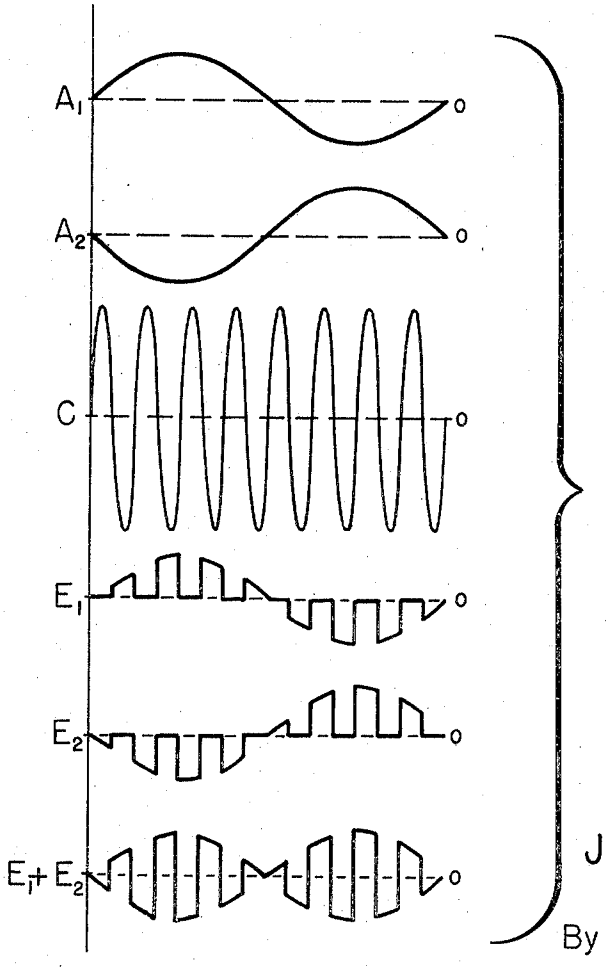
Figure 3:
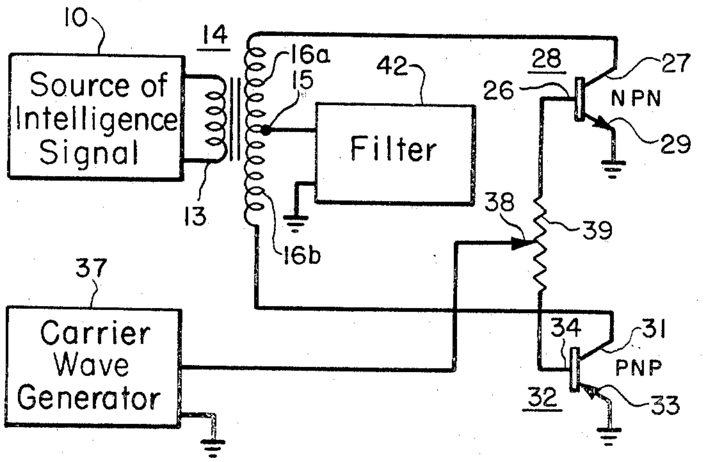
Figure 4:
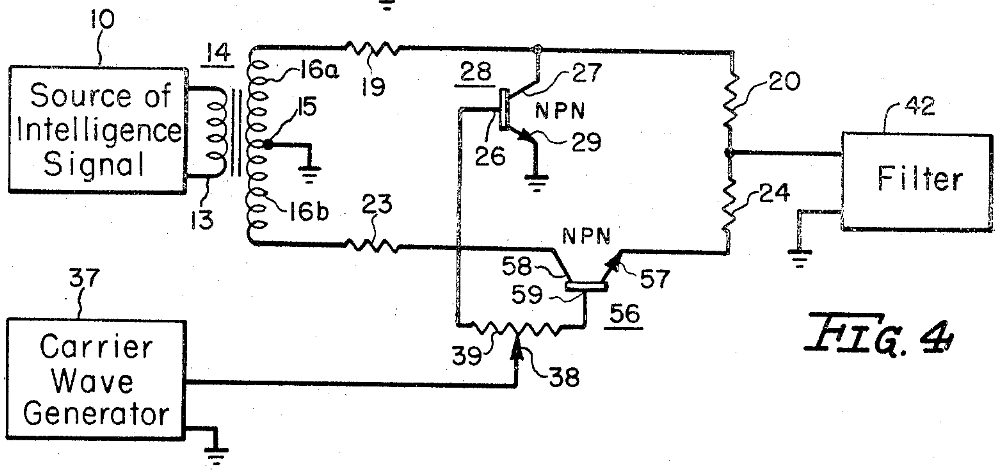
Figure 5:
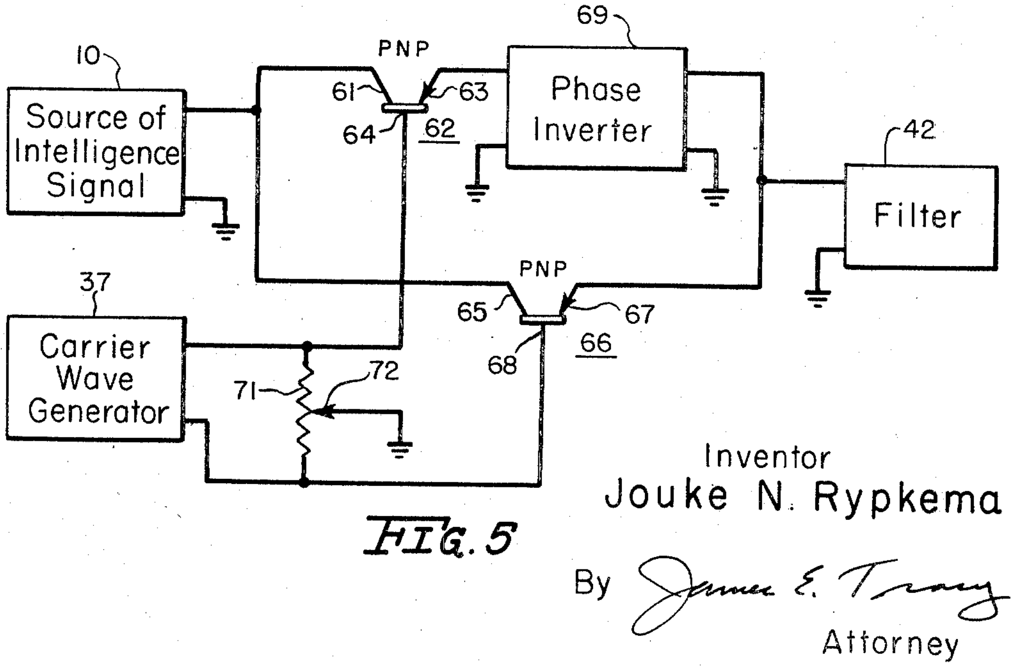

The features of this invention which are believed to be new are set forth with particularly in the appended claims. The invention, together with further objects and advantages thereof, may best be understood, however by reference to the following description in conjunction with the accompanying drawings, in the figures of which like reference numerals identify like elements, and in which:

FIGURE 1 is a a schematic representation of a doubly balanced modulator constructed in accordance with one embodiment of the invention;

FIGURE 2 shows a family of idealized voltage signal waveforms which appear at different points within the modulator of FIGURE 1 as indicated by reference letters (most of which are subscript) and are identified by corresponding letter designations in FIGURE 2; and FIGURES 3, 4 and 5 are schematic representations of three different doubly balanced modulators respectively constructed in accordance with three additional embodiments of the invention.

Turning now to the embodiment of FIGURE 1, block 10 represents a source of intelligence signal, such as an audio signal, having its output terminals connected to the primary winding 13 of a transformer 14 which has a center-tapped secondary winding divided by its center tap 15 into upper and lower winding section 16*a*, 16*b*, respectively. Center tap 15 is connected to a plane of reference potential such as ground. The upper terminal of winding section 16*a* is coupled through a pair of series-connected resistors 19 and 20 to the upper terminal of a load resistor 22, the lower terminal of which is connected to ground. The lower terminal of winding section **16*b* is similarly coupled via a pair of series-connected resistors 23 and 24 to the upper terminal of resistor 22. The junction of resistors 19 and 20 is connected to the collector 27 of a junction type switch transistor 28 of NPN gender, the emitter 29 of which is grounded. The junction of resistors 23 and 24 is coupled to the collector 31 of a junction type switching transistor 32 of the PNP variety, the emitter 33 of which is connected to ground. Each of transistors 28, 32** constitutes a bidirectional switching transistor having first, second and control terminals (collector, emitter and base respectively) and which is turned ON (driven into saturation) in response to one voltage condition on its control or base terminal to permit bidirectional current translation between its first and second terminals and which is turned OFF (driven to cutoff) responsive to another voltage condition on its control terminal to prevent the translation of current between its collector and emitter.

Each of transistors 28, 32 may be of unsymmetrical, inexpensive construction; moreover, they need not be matched. Each of the transistors need only have quasi bidirectional properties. In other words, each transistor should have a reverse current gain or beta as well as a forward current gain or beta, but the reverse beta need only be a small fraction of the forward beta. It will still be possible to drive each of the transistors into saturation and achieve current flow either in the direction from collector to emitter (the forward mode for an NPN transistor) or from emitter to collector (the reverse mode for an NPN transistor). Having a reverse beta smaller than its forward beta merely means that more base drive current is required to saturate the transistor when operating in its reverse mode than is required when operating in its forward mode.

For example, with collector 27 of transistor 28 established at a positive potential with respect to its emitter 29 and with the base-emitter junction forward biased (base 26 being at a positive potential relative to the potential at emitter 29) sufficiently to drive the transistor into saturation, current will flow in the direction from collector to emitter. In this case, it is the forward beta that will determine the magnitude of the base drive current required to saturate the transistor. On the other hand, when emitter 29 is positive with respect to collector 27 and the base-collector junction is forward biased (base 26 being positive with respect to collector 27) to the extent necessary to drive the transistor into saturation, current flow occurs in the direction from emitter to collector. The reverse beta will now determine the amount of base current needed to achieve saturation. If the forward current gain is substantially greater than the reverse current gain, as may be the case, higher amplitude base drive current is necessary to saturate the transistor for its reverse mode of operation as compared to its forward mode.

Each of transistors 28, 32 is turned ON (driven into its saturated or conductive condition) and OFF (rendered nonconductive or cutoff) by means of an alternating carrier wave developed by a generator 37. The carrier wave is applied to the transistors in a manner to turn the transistors ON in alternation—when one of the transistors is conductive the other is cutoff and vice-versa. This is accomplished by connecting one of the output terminals of generator 37 to ground and the other to the adjustable tap or slider 38 of a potentiometer 39, the two fixed terminals of the potentiometer being respectively connected to the control terminal or base 26 of transistor 28 and the control terminal or base 34 of transistors 32. Since the transistors are of opposite gender in FIGURE 1, merely a single-ended output of generator 37 is necessary.

Generator 37 may produce an alternating carrier wave having an appropriate fundamental frequency and may exhibit a variety of different waveforms, such as sinusoidal, triangular, trapezoidal, sawtooth, etc. As illustrated in the FIGURE 1 embodiment, the carrier wave developed by unit 37 is of generally sinusoidal waveshape. Preferably, its amplitude is large compared to the amplitude of the intelligence signal produced by source 10.

As will be described, the modulator of FIGURE 1 develops across load resistor 22 a suppressed carrier amplitude modulated signal containing the modulation sidebands of the carrier fundamental (namely, the sum and difference frequencies of the carrier fundamental frequency and the intelligence signal frequencies) and the modulation sidebands of the odd harmonics of the fundamental. A filter circuit 42 is coupled across resistor 22 to select only those signal components in the suppressed carrier signal that are to be utilized. For example, the filter may be constructed to accept only the upper sideband of the carrier fundamental. The output of filter 42 may, of course, be coupled to any utilizing circuitry (not shown) as determined by the particular purpose to be served by the illustrated modulator.

As will be seen, the modulator of FIGURE 1 has two signal translating channels, each having conductive and nonconductive states, coupled between source 10 and filter 42. The channels are switched by the carrier wave to their conductive states in alternation to translate opposed phases of the intelligence signal to filter 42 through the channels in alternation.

In considering now the detailed operation of the suppressed carrier modulator of FIGURE 1, reference should also be made to the idealized voltage signal waveforms shown in FIGURE 2. Source 10 develops an intelligence signal which is converted to a pair of push-pull or phase-opposed outputs by the expedient of transformer 14. In other words, the intelligence signal appearing at the upper terminal of winding section **16*a* is of one phase, while that same intelligence signal simultaneously appears at the lower terminal of winding section 16*b* with opposite phase. For illustrative purposes it is assumed that the intelligence signal applied to primary 13 is of sinusoidal waveshape. Hence, the voltage waveforms of that intelligence signal appearing at the upper terminal of winding 16*a* and the lower terminal of winding 16*b*** will be that shown by curves $A_1$ and $A_2$, respectively.

Ignoring the presence of transistors 28 and 32 (namely, assuming that those transistors are both established in their respective OFF conditions), the intelligence signal of waveform $A_1$ will be translated via resistors 19 and 20 to load resistor 22 and the input of filter 42. Simultaneously, the intelligence signal of curve $A_2$ will be supplied to resistor 22 and filter 42 by way of resistors 23 and 24. If the two paths for the push-pull signals of curves $A_1$ and $A_2$ are perfectly symmetrical those signals will cancel or balance out across the load circuit comprising resistor 22 and the input of filter 42. There will thus be a zero output.

In considering now the effect of transistors 28 and 32, it will initially be assumed that they are perfectly matched in complementary symmetry having, among other identical characteristics, the same forward betas and the same reverse betas. It will also be assumed that the waveshape of the carrier wave developed by generator 37 is of pure sinusoidal waveshape, as shown by curve C. Under these assumed conditions, the adjusted tap 38 will be positioned to the midpoint of potentiometer 39 so that the carrier wave of curve C will be applied to bases 26 and 34 with equal amplitude. The amplitude of the carrier wave as applied to base 26 will be sufficient to turn transistor 28 ON for substantially the entire time interval of each of the positive half cycles of the carrier wave of curve C, and this will be true for the negative as well as the positive half cycle of waveform $A_1$. Conversely, the amplitude of the carrier wave as applied to base 34 will be adequate to turn transistor 32 ON (for both half cycles of curve $A_2$) during substantially the entire interval of each of the negative half cycles of waveform C. The negative half cycles of the carrier wave will cut transistor 28 OFF while the positive half cycles of the carrier wave will turn transistor 32 OFF.

When transistor 28 is turned ON by the positive half cycles of the carrier wave, the impedance between collector 27 and emitter 29 becomes very small and thus the junction of resistors 19 and 20 is essentially grounded. Hence, during the conduction time intervals of transistor 28 the voltage of waveform $A_1$ is dropped substantially entirely across resistor 19 and a zero output signal results across load resistor 22. Waveform $E_1$ represents the voltage signal appearing across resistor 22 as a result of the operation of transistor 28. In that waveform it will be noted that during the ON times of the transistor, the output voltage will be zero.

When transistor 28 is in its ON condition, current flows between collector 27 and emitter 29 in a direction depending on the polarity of the voltage of waveform $A_1$. Specifically, during the positive half cycle of curve $A_1$, current flows in the direction from collector to emitter, whereas during the negative half cycle current will flow in the reverse direction.

During the occurrence of each negative half cycle of the carrier wave, transistor 28 will be turned OFF and a relatively high impedance will now be introduced between ground and the junction of resistors 19 and 20. The voltage signal of curve $A_1$ will therefore be applied via resistors 19 and 20 to resistor 22 and the input of filter 42, as may be noted in waveform $E_1$. The operation of transistor 28 effectively translates only sampled portions of the intelligence signal of curve $A_1$ to the common load circuit. Elements 16a, 19, 28 and 20 provide a first signal translating channel, from source 10 to resistor 22 and filter 42, which is established in its conductive state when transistor 28 is OFF, and vice-versa.

Transistor 32 operates in similar fashion to produce the voltage signal of waveform $E_2$ across resistor 22. During each positive half cycle of the carrier wave of curve C transistor 32 is cut off and the intelligence signal of waveform $A_2$ is delivered to resistor 22 and the input of filter 42. During the intervening negative half cycle intervals of the carrier wave, transistor 32 is driven into saturation, or its ON condition, to short the junction of resistors 23 and 24 to ground, thereby preventing the intelligence signal from reaching resistor 22. Elements 16b, 23, 32 and 24 thus provide a second signal translating channel, from source 10 to resistor 22, which is conductive when transistor 32 is OFF and when the first channel is nonconductive.

Since the voltage signals of curves $E_1$ and $E_2$ appear simultaneously across resistor 22, the net signal will be an addition of $E_1$ and $E_2$ as shown in the lowermost curve of FIGURE 2. This $E_1+E_2$ signal is a suppressed carrier amplitude modulated signal in which the original intelligence signal, the carrier fundamental and all harmonics thereof, and the modulation sidebands of the even harmonics of the fundamental frequency are all cancelled out or suppressed, leaving only the modulation sidebands of the fundamental and the sidebands of the odd harmonics of the fundamental. That make up or composition of the suppressed carrier signal of curve $E_1+E_2$ may easily be demonstrated mathematically. Filter 42 selects only those components that are to be utilized; it may, for example, filter out everything except the upper sideband of the fundamental.

Assume now that the modulator of FIGURE 1 is not perfectly balanced due to any one or more of a variety of different causes. For example, transistors 28 and 32 may have dissimilar forward betas or reverse betas, thereby saturating or turning ON at different base drive voltages. As another example, the carrier wave of curve C may be somewhat nonsinusoidal thereby having distortion that destroys its symmetry about its A.C. axis. Unbalanced operation of the modulator results in that transistors 28 and 32 will be established in their respective ON conditions for unequal time intervals and in their respective OFF conditions for different time intervals. The two signal translating channels will consequently be established in their conductive states for unequal time intervals and this will result in the introductiton of undesired signal components in the suppressed carrier amplitude modulated signal supplied to filter 42. It can be shown mathematically that these undesired signal components include the modulation sidebands of the even harmonics of the carrier fundamental and also components of the original intelligence signal.

Such unbalanced operating conditions may, however, be simply corrected in the modulator of FIGURE 1, and for that reason the selection of the circuit elements and the shape of the carrier wave are not critical. In accordance with one of the salient features of the invention, means are provided for adjusting the conduction time intervals of the two signal translating channels to effect equalization thereof and consequently to achieve balanced operation with the result that the undesired signal components in the suppressed carrier signal are cancelled. Specifically, potentiometer 39 in FIGURE 1 facilitates the adjustment of the amplitude of the carrier wave as applied to the control terminal or base of each of transistors 28, 32 to equalize their ON times and consequently their OFF times. Moving tap 38 away from the midpoint of the potentiometer and toward base 26 increases the amplitude of the carrier wave as applied to base 26, while at the same time the carrier wave applied to base 34 is reduced. This increases each ON time interval of transistor 28 while the ON time intervals of transistor 32 are decreased. Conversely, adjusting slider 38 toward base 34 increases the conduction time of transistor 32 and reduces the conduction time of transistor 28. The potentiometer may therefore easily be adjusted to achieve precise equalization of the ON times and the OFF times for the two transistors. It will be noted that balanced operation does not necessarily require a 50% duty cycle for each transistor; namely equalization of the ON and OFF times. It merely requires that the ON time intervals of one transistor equal the ON time intervals of the other transistor, and this may be less than half of a complete cycle of the carrier wave. Equal ON times will necessarily result in the OFF times for the two transistors being equal.

To summarize the invention as embodied in FIGURE 1, the doubly balanced modulator there illustrated comprises an intelligence signal source 10 and a common load circuit including load resistor 22 and the input impedance of filter 42. A first signal translating channel (elements 16a, 19, 28 and 20), coupled between source 10 and the load circuit, has a first switching transistor 28 for selectively establishing the first channel in either a conductive state in which the intelligence signal (waveform $A_1$) is translated with one phase to the load circuit, or in a nonconductive state in which the intelligence signal is effectively prevented from reaching the load circuit. A second signal translating channel (elements 16b, 23, 32 and 24), coupled between source 10 and the load circuit, includes a second switching transistor 32 for selectively establishing the second channel in either a conductive state in which the intelligence signal (waveform $A_2$) is delivered with opposite phase to the load circuit, or in a nonconductive state in which the intelligence signal is effectively prevented from reaching the load circuit. Generator 37 produces an alternating carrier wave having a predetermined fundamental frequency, and this carrier wave is applied, via potentiometer 39, to both of the switching transistors to condition the first and second channels to their respective conductive states in alternation thereby to translate the intelligence signal to the load circuit through the channels in alternation to develop in the load circuit a desired suppressed carrier amplitude modulated signal which is subject to the introduction of undesired signal components (such as the modulation sidebands of the even harmonics of the carrier fundamental) in the event that the first and second channels are established in their conduction states for unequal time intervals. Potentiometer 39 provides means for adjusting the amplitude of the carrier wave as applied to at least one of the switching transistors to equalize the time intervals during which the first and second channels are conductive, thereby to cancel the undesired signal components.

Of course, the modulator of FIGURE 1 may be employed in a variety of different systems and finds many different uses. One particular use to which the modulator may be applied is found in the audio decoding apparatus of a subscription television receiver. Very effective audio scrambling has been achieved in a subscription television transmitter by employing heterodyning or modulating techniques to frequency displace the audio information, which originally contains frequency components from 0–12,000 cycles per second or hertz, to a portion of the frequency spectrum where it does not normally reside. For convenience, the audio signal may be shifted or moved by exactly 2,625 hertz to a higher portion of the spectrum, namely to the frequency range from 2,625–14,625 hertz. Frequency shifting of 2,625 hertz results in a coded audio signal which may be conveniently frequency modulated on the audio carrier in the television transmitter while at the same time complying with the television transmission standards presently existing in the United States. A frequency displacement by that amount results in excellent audio coding inasmuch as a receiver, not equipped with suitable compensating decoding circuitry, would be unable to unscramble the audio and derive any intelligence therefrom.

To effect decoding at a subscription television receiver, the scrambled audio components must be heterodyned back to their original frequencies. In other words, 2,625 hertz must be subtracted from the frequency of each of the coded audio components. This may conveniently be accomplished by a double amplitude modulation process with two carriers, one of which has a frequency equal to the horizontal or line scanning frequency in the United States (namely 15,750 hertz), called H for convenience, while the other carrier has a frequency of 1⅙ H or 18,375 hertz. A first modulator, which may be a doubly balanced modulator of the construction of FIGURE 1, operates in response to the received coded intelligence or audio signal (2,625–14,625 hertz) and the H carrier to develop a suppressed carrier amplitude modulated signal from which is filtered out the upper modulation sideband of the carrier fundamental, occupying the frequency range from 18,375 to 30,375 hertz. This sideband in turn may be heterodyned in a second modulator with the 1⅙ H or 18,375 hertz carrier and the lower sideband, which would extend from zero to 12,000 hertz, may be filtered out of the output of the second modulator to provide the decoded audio signal.

One of the advantages of the FIGURE 1 modulator in the audio decoder just described is that generator 37 need only be a source of a single phase sinusoidal signal of the horizontal synchronizing frequency, which is readily available in the receiver. Another advantage is that oppositely-phased or push-pull audio signals may conveniently be derived from the audio detector.

In the embodiment of FIGURE 1, the switching transistor in each of the two signal translating channels serves as a shunt or parallel switch, and each channel is in its conductive state when its associated transistor is OFF or nonconductive. In the embodiment of FIGURE 3, transistors 28 and 32 are connected as series switches in their associated channels, and each channel is conductive when its transistor is ON. The FIGURE 3 embodiment also constitutes a simplification over FIGURE 1 in that resistors 19, 20, 22, 23 and 24 are not needed. This is made possible by the particular manner in which filter 42 is connected in FIGURE 3. Specifically, center tap 15 of the secondary winding of transformer 14 is connected to one input terminal of filter 42, the other of which is grounded. The input impedance of the filter serves as the common load circuit for the two signal translating channels.

The modulator of FIGURE 3 may be characterized as having two series circuits. The first series circuit includes one push-pull output (winding 16*a*) of the intelligence signal source, the common load circuit or input impedance of filter 42, and switching transistor 28 which is turned ON by the positive half cycles of the carrier wave to render the series circuit conductive and permit bidirectional current flow between the push-pull output and the load circuit and which is turned OFF by the negative half cycles to prevent the translation of current therebetween. The second series circuit includes the other push-pull output (winding 16*b*) of the intelligence signal source, the common load circuit, and switching transistor 32 which is turned ON by the negative half cycles of the carrier wave to render that series circuit conductive and permit bidirectional current flow between the other push-pull output and the load circuit and which is turned OFF by the positive half cycles of the carrier wave to prevent the translation of current therebetween. The current flow through the two series circuits is added in the input of filter 42 in order to develop the required suppressed carrier amplitude modulated signal containing only desired signal components, assuming that potentiometer 39 is properly adjusted in FIGURE 3 to correct any conditions that would otherwise cause unbalanced operation.

The two transistors in each of the embodiments of FIGURES 1 and 3 are of opposite gender, but this, of course, is not necessary. FIGURE 4 shows one manner in which the embodiment of FIGURE 1 may be modified to employ transistors of the same gender. Transistor 28 in FIGURE 4 functions as a shunt switch, as in FIGURE 1. Transistor 32, however, is replaced by the NPN transistor 56 connected as a series switch in its associated channel. Specifically, the emitter 57 of transistor 56 is connected to the lower terminal of resistor 24 while collector 58 connects to the right terminal of resistor 23, the base 59 being connected to one of the fixed terminals of potentiometer 39. Resistor 22 is not included in the embodiment of FIGURE 4 since its function may be performed by the input impedance of filter 42.

In FIGURE 4, both of the transistors 28, 56 are turned ON at the same time, namely during the time intervals of the positive half cycles of the carrier wave. However, the two signal translating channels coupled between source 10 and the common load circuit (the input circuit of filter 42) will still be conditioned to their respective conductive states in alternation to translate the intelligence signal in push-pull to the load circuit through the channels in alternation as is required to develop a suppressed carrier amplitude modulated signal in the input of the filter. This occurs since the intelligence signal across winding 16*a* reaches the input to filter 42 only when transistor 28 is OFF, while the signal developed by winding 16*b* is delivered to the filter only when transistor 56 is ON.

The variation of the invention, as embodied in FIGURE 5, illustrates that like gender transistors, connected as series switches, may be employed, and furthermore, it is not necessary to supply push-pull intelligence signals to the two channels. Accordingly, one output terminal of source 10 is grounded while the other is connected to the collector 61 or a PNP transistor 62 and also to the collector 65 of a PNP transistor 66. The emitter 63 of transistor 62 is coupled through a phase inverter 69 to filter 42, while emitter 67 of transistor 66 is directly connected to the filter. The carrier wave is applied with opposite polarity to base 64 and base 68 of transistors 62, 66, respectively. This is achieved by connecting one output terminal of generator 37 to base 64, the other output terminal to base 68, and by connecting a potentiometer 71 therebetween, the adjsutable tap 72 of which is grounded. This potentiometer serves the same function as potentiometer 39 in the other embodiments since the adjustment of tap 72 alters the amplitude of the carrier wave as applied to each of the two transistors.

Transistors 62 and 66 in FIGURE 5 will be turned ON in alternation by the phase opposed carrier waves applied thereto and thus the two channels will be established in their conductive states in alternation. When transistor 66 is ON the intelligence signal from source 10 is translated to the input of filter 42 without a phase change, while during the intervening intervals when transistor 62 is ON the intelligence signal is applied to the filter with a 180° phase shift introduced by phase inverter 69. The net result is that the input of the filter in FIGURE 5 develops the required suppressed carrier amplitude modulated signal.

The invention, of course, lends itself to many different variations. For example, different devices may be employed to accomplish the switching function. As one illustration, the switches may comprise field effect transistors. Such a transistor is similar to a junction type transistor to the extent that it has first, second and control terminals and is turned ON in response to one voltage condition on its control terminal to permit bidirectional current translation between its first and second terminals and is turned OFF responsive to another voltage condition on its control terminal to prevent the translation of current between its first and second terminal.

The invention provides, therefore, an improved doubly balanced modulator which features a pair of signal translating channels rendered conductive in alternation under the control of a carrier wave to translate opposed phases of an intelligence signal through the channels in alternation to develop in a common load circuit a desired suppressed carrier amplitude modulated signal, and wherein the conduction time intervals of at least one of the channels may be adjusted to equal those of the other channel to effect cancellation of any undesired signal components that may otherwise manifest in the suppressed carrier signal.

I claim:

1. A doubly balanced modulator comprising:

a source of intelligence signal;

a common load circuit;

a first signal translating channel, coupled between said source and load circuit, having a conductive state in which said intelligence signal is translated with one phase to said load circuit and a nonconductive state in which said intelligence signal is effectively prevented from reaching said load circuit;

a second signal translating channel, coupled between said source and load circuit, having a conductive state in which said intelligence signal is delivered with opposite phase to said load circuit and a nonconductive state in which said intelligence signal is effectively prevented from reaching said load circuit;

a generator for developing an alternating carrier wave having a predetermined fundamental frequency;

means for utilizing said carrier wave to condition said first and second channels to their respective conductive states in alternation thereby to translate said intelligence signal to said load circuit through said channels in alternation to develop in said load circuit a desired suppressed carrier amplitude modulated signal which is subject to the introduction of undesired signal components in the event that said first and second channels are established in their conductive states for unequal time intervals; and means for adjusting the conduction time intervals of at least one of said channels to equal the conduction intervals of the other channel to effect cancellation of the undesired signal components.

2. A doubly balanced modulator according to claim 1 in which said adjusting means adjusts the conduction time intervals of both of said first and second channels to effect equalization thereof with a resulting cancellation of the undesired signal components.

3. A doubly balanced modulator according to claim 1 in which the undesired signal components include modulation sidebands of some of the harmonics of the carrier fundamental.

4. A doubly balanced modulator according to claim 1 in which the undesired signal components include components of the original intelligence signal.

5. A doubly balanced modulator according to claim 1 in which each of said first and second channels, when in its conductive state, permits bidirectional current flow between said intelligence signal source and said load circuit.

6. A doubly balanced modulator according to claim 1 in which the intelligence signal, the carrier fundamental and all harmonics thereof, and the modulation sidebands of the even harmonics of the fundamental are all cancelled out in the suppressed carrier amplitude modulated signal, leaving only the modulation sidebands of the fundamental and the sidebands of the odd harmonics of the fundamental, the undesired signal components including modulation sidebands of the even harmonics of the fundamental.

7. A doubly balanced modulator according to claim 6 in which said common load circuit includes a filter for selecting one of the modulation sidebands of the carrier fundamental.

8. A doubly balanced modulator according to claim 1 in which said first channel includes a first switching transistor for selectively establishing said first channel in either its conductive state or nonconductive state, wherein said second channel includes a second switching transistor for selectively establishing said second channel in either its conductive state or nonconductive state, in which said carrier wave is applied to both of said switching transistors to condition said first and second channels to their respective conductive states in alternation, and wherein said adjusting means adjusts the amplitude of said carrier wave as applied to at least one of said switching transistors to equalize the time intervals during which said first and second channels are conductive.

9. A doubly balanced modulator according to claim 8 in which each of said transistors constitutes a series switch in the channel in which it is included.

10. A doubly balanced modulator according to claim 8 in which each of said transistors constitutes a shunt switch in the channel in which it is included.

11. A doubly balanced modulator according to claim 8 wherein each of said first and second switching transistors has a control terminal to which said carrier wave is applied to determine the operating state of the channel in which the transistor is included, and wherein a potentiometer is coupled between the control terminals of said transistors with the adjustable tap of the potentiometer connected to said carrier wave generator to facilitate adjustment of the amplitude of said carrier wave as applied to the control terminal of each of said transistors to equalize the conduction time intervals of the two channels.

12. A doubly balanced modulator comprising:

a source of intelligence signal having a pair of push-pull outputs;

a common load circuit;

a first series circuit including one of said push-pull outputs of said intelligence signal source, said common load circuit, and a first switching transistor which may be turned ON to render said first series circuit conductive and permit bidirectional current flow between said one push-pull output and said load circuit and which may be turned OFF to prevent the translation of current between said one output and said load circuit.

a second series circuit including the other of said push-pull outputs of said intelligence signal source, said common load circuit, and a second switching transistor which may be turned ON to render said second series circuit conductive and permit bidirectional current flow between said other push-pull output and said load circuit and which may be turned OFF to prevent the translation of current between said other output and said load circuit.

a generator for developing an alternating carrier wave having a predetermined fundamental frequency;

means for applying said carrier wave to both of said transistors to turn said transistors ON in alternation thereby to translate said intelligence signal to said load circuit through said first and second series circuits in alternation to develop in said load circuit a desired suppressed carrier amplitude modulated signal which is subject to the introduction of undesired signal components in the event that said first and second transistors are established in their ON conditions for unequal time intervals; and means for adjusting the amplitude of said carrier wave as applied to at least one of said switching transistors to equalize the time intervals during which said first and second series circuits are conductive thereby to cancel the undesired signal components.

13. A doubly balanced modulator comprising:

a source of intelligence signal;

a pair of bidirectional switching transistors each having first, second and control terminals and each of which transistors is turned ON in response to one voltage condition on its control terminal to permit bidirectional current translation between its first and second terminals and each of which transistors is turned OFF responsive to another voltage condition on its control terminal to prevent the translation of current between its first and second terminals;

means coupling said intelligence signal source to said first terminal of each of said transistors for applying said intelligence signal to said transistors in phase opposition;

a common load circuit;

means coupling both of said second terminals to said load circuit;

means for developing an alternating carrier wave having a predetermined fundamental frequency;

means for applying said carrier wave to said control terminal of each of said transistors to condition said transistors to their respective ON states in alternation thereby to translate said intelligence signal to said load circuit through said transistors in alternation to develop in said load circuit a desired suppressed carrier amplitude modulated signal which is subject to the introduction of undesired signal components in the event that said transistors are established in their ON states for unequal time intervals; and means for adjusting the amplitude of said carrier wave as applied to at least one of said switching transistors to equalize the time intervals during which said transistors are conductive thereby to cancel the undesired signal components.

References Cited

UNITED STATES PATENTS

| | | | |
|---|---|---|---|
| 3,096,492 | 7/1963 | Vogt | 332—43 |
| 3,101,455 | 8/1963 | Masher | 332—44 X |
| 3,229,230 | 1/1966 | Feldman | 332—44 |
| 3,230,467 | 1/1966 | Atherton et al. | 330—15 |
| 3,237,129 | 2/1966 | Allen et al. | |
| 3,239,780 | 3/1966 | Echarti | 332—38 |

ALFRED L. BRODY, Primary Examiner

U.S. Cl. X.R.

307—243, 255; 325—138; 330—15; 332—43, 44